(12) United States Patent
Albarede et al.

(10) Patent No.: US 9,548,189 B2
(45) Date of Patent: Jan. 17, 2017

(54) PLASMA ETCHING SYSTEMS AND METHODS USING EMPIRICAL MODE DECOMPOSITION

(71) Applicant: Lam Research Corporation, Fremont, CA (US)

(72) Inventors: Luc Albarede, Fremont, CA (US); Yassine Kabouzi, Fremont, CA (US); Jorge Luque, Redwood City, CA (US); Andrew D. Bailey, III, Pleasanton, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 17 days.

(21) Appl. No.: 14/694,356

(22) Filed: Apr. 23, 2015

(65) Prior Publication Data

US 2016/0314943 A1    Oct. 27, 2016

(51) Int. Cl.
*H01J 37/32*    (2006.01)

(52) U.S. Cl.
CPC ...... *H01J 37/32963* (2013.01); *H01J 37/3299* (2013.01); *H01J 37/32981* (2013.01); *H01J 2237/334* (2013.01)

(58) Field of Classification Search
None
See application file for complete search history.

(56) References Cited

U.S. PATENT DOCUMENTS

| 6,815,362 | B1 | 11/2004 | Wong et al. |
| 7,952,694 | B2 | 5/2011 | Howard et al. |
| 8,144,328 | B2 | 3/2012 | Venugopal et al. |
| 2011/0319734 | A1* | 12/2011 | Gottlieb ............ A61B 5/14503 600/347 |

OTHER PUBLICATIONS

Scott Bushman, Thomas F. Edgar, and Isaac Trachtenberg, Modeling of Plasma Etch Systems Using Ordinary Least Squares, Recurrent Neural Network, and Projection to Latent Structure Models; J. Electrochem. Soc., vol. 144, No. 4, Apr. 1997.*
H. H Henry Yue, S. Joe Qin, Joseph Wiseman and Anthony Toprac; Plasma etching endpoint detection using multiple wavelengths for small open-area wafers; J. Vac. Sci. Technol. A 19.1., Jan./Feb. 2001.*

(Continued)

*Primary Examiner* — Allan Olsen

(57) ABSTRACT

A substrate etching system includes an etching control module, a filtering module, and an endpoint module. The etching control module selectively begins plasma etching of a substrate within an etching chamber. The filtering module, during the plasma etching of the substrate: receives a signal including endpoint information; decomposes the signal using empirical mode decomposition (EMD); and generates a filtered signal based on results of the EMD. The endpoint module indicates when an endpoint of the plasma etching of the substrate has been reached based on the filtered signal. The etching control module ends the plasma etching of the substrate in response to the indication that the endpoint of the plasma etching of the substrate has been reached.

11 Claims, 11 Drawing Sheets

(56) References Cited

OTHER PUBLICATIONS

Sang Jeen Hong, Gary S. May, Dong-Cheol Park; Neural Network Modeling of Reactive Ion Etching Using Optical Emission Spectroscopy Data; IEEE Transactions on Semiconductor Manufacturing, vol. 16, No. 4, Nov. 2003.*

John V. Ringwood, Shane Lynn, Giorgio Bacelli, Beibei Ma, Emanuele Ragnoli, Sean McLoone; Estimation and Control in Semiconductor Etch: Practice and Possibilities; IEEE Transactions on Semiconductor Manufacturing, vol. 23, No. 1, Feb. 2010.*

The Empirical Mode Decomposition and the Hilbert Spectrum for Nonlinear and Non-stationary Time Series Analysis; Norden E. Huang et al.; Proc. R. Soc. Lond. A (1998); pp. 903-995.

"Hilbert-Huang Transform." Wikipedia, Wikimedia Foundation, n.d. Web. Mar. 3, 2015.

The Empirical Mode Decomposition in Real-Time; P. Trnka et al; 18th International Conference on Process Control; Tatranska Lomnica, Slovakia, Jun. 14-17, 2011. 7 pgs.

Empirical Mode Decomposition as a Filter Bank; Patrick Flandrin et al.; IEEE Signal Processing Letters, 2003. 4 pgs.

* cited by examiner

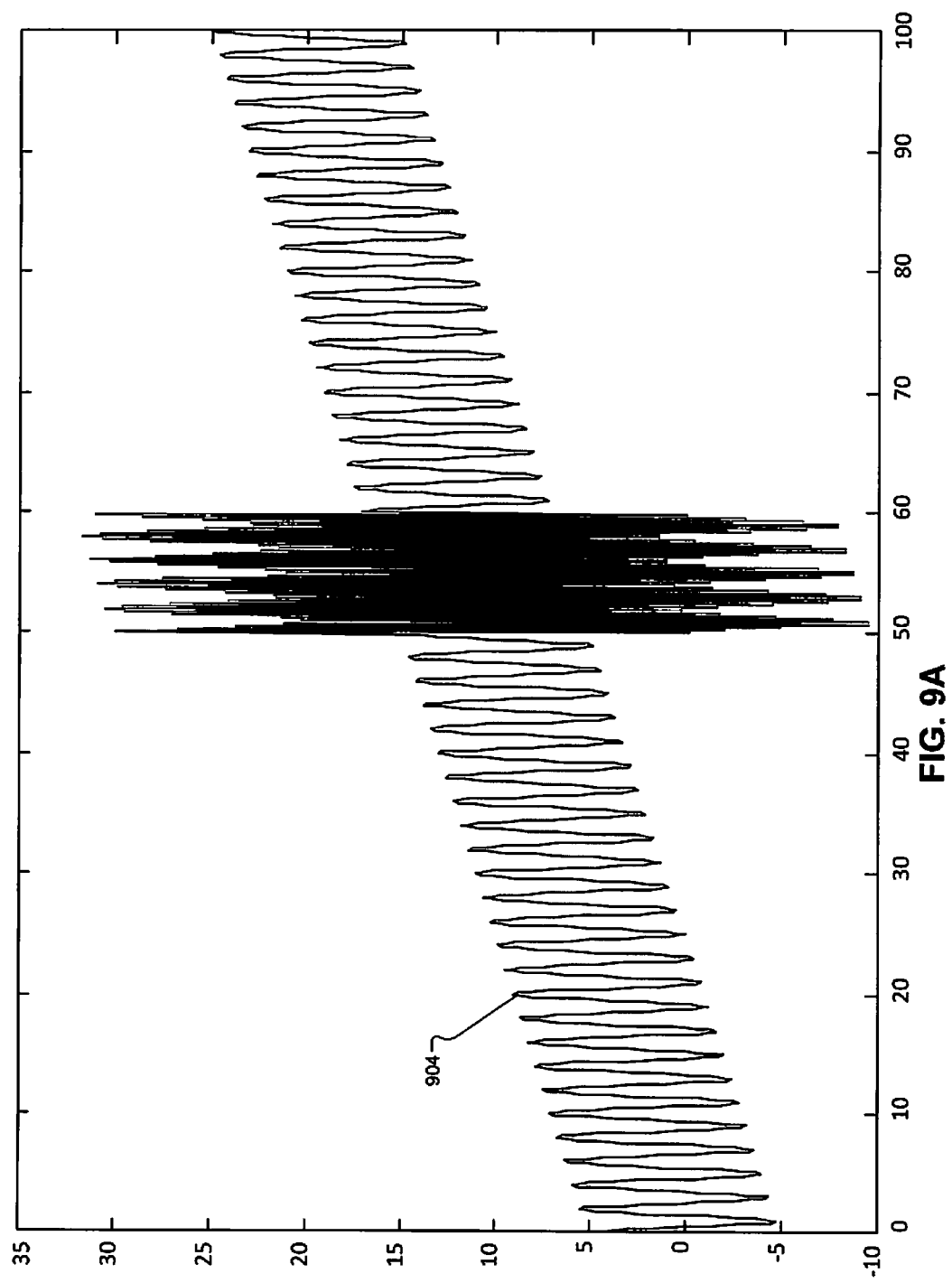

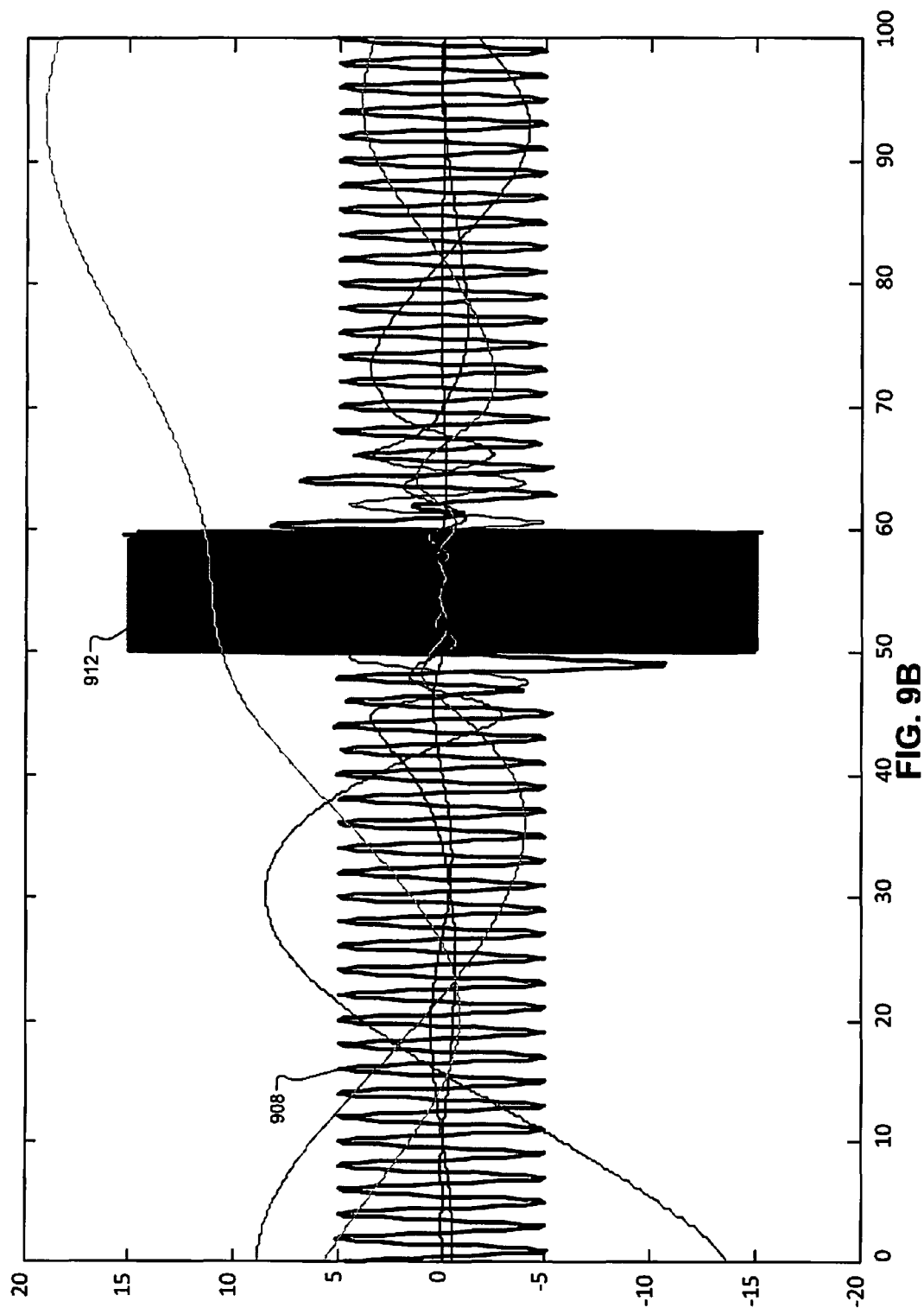

PLASMA ETCHING SYSTEMS AND METHODS USING EMPIRICAL MODE DECOMPOSITION

FIELD

The present disclosure relates to substrate processing system and methods and more particularly plasma etching systems and methods.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Advances in plasma processing have facilitated growth in the semiconductor industry. During plasma processing, diagnostic tools may be employed to ensure high yield and reliability of devices being processed. Optical emission spectroscopy (OES) may be used as a diagnostic tool for gas-phase monitoring of etchants and etched products to maintain control of process parameters.

Plasma has optical emission spectral characteristics that are a function of multiple variables including, but not limited to, constituent gas species, pressure, energy density, driving power, and the like. The optical emission spectrum of plasma includes, but is not limited to, deep ultra-violet (UV) through far infra-red (IR) wavelengths, and may be observed using a spectrometer.

Optical monitoring of plasma may be performed by collecting an optical emission spectrum via a collimator through a quartz window of a plasma etch chamber. The spectral information, transmitted via a collector fiber optic bundle, may be measured by the spectrometer. With the spectral information from the optical monitoring, a considerable amount of information relating to constituent species may be collected and analyzed to provide guidance for process monitoring and control during plasma processing.

SUMMARY

A substrate etching system includes an etching control module, a filtering module, and an endpoint module. The etching control module selectively begins plasma etching of a substrate within an etching chamber. The filtering module, during the plasma etching of the substrate: receives a signal including endpoint information; decomposes the signal using empirical mode decomposition (EMD); and generates a filtered signal based on results of the EMD. The endpoint module indicates when an endpoint of the plasma etching of the substrate has been reached based on the filtered signal. The etching control module ends the plasma etching of the substrate in response to the indication that the endpoint of the plasma etching of the substrate has been reached.

In other features, the results of the EMD include one or more components including endpoint information, one or more components including noise information, and a final residual. The filtering module generates the filtered signal based on the one or more components including endpoint information and the final residual and independent of the one or more components including noise information.

In other features, a normalization module receives a second signal including endpoint information, receives a third signal not including endpoint information, normalizes the second signal relative to the third signal to produce the signal including endpoint information, and outputs the signal including endpoint information to the filtering module.

In other features, the normalization module selects the third signal based on one or more operating parameters of the substrate etching system.

In other features, the normalization module selects a confinement ring signal generated by a confinement ring sensor as the third signal when a confinement ring is moving within the etching chamber.

In other features, the normalization module selects a power signal indicating a power of the etching chamber as the third signal when a power supply that supplies power to the etching chamber is being tuned.

In other features: a first optical emission spectroscopy (OES) sensor that generates the second signal based on optical characteristics of plasma within the etching chamber; and a second OES sensor that generates the third signal independent of the plasma within the etching chamber.

In other features, a normalization module normalizes a first portion of a second signal relative to a second portion of the second signal to produce the signal including endpoint information and outputs the signal including endpoint information to the filtering module. The first portion of the second signal includes endpoint information, and the second portion of the second signal does not include endpoint information.

In other features, the normalization module selects the second portion of the second signal based on one or more operating parameters of the substrate etching system.

In other features, the endpoint module indicates that the endpoint of the plasma etching of the substrate has been reached when a change in the filtered signal is greater than a predetermined value.

In other features, the etching control module: opens a gas source and actuates a power source to apply power to begin the plasma etching of the substrate; and closes the gas source and actuates the power source to end the plasma etching of the substrate in response to the indication that the endpoint of the plasma etching of the substrate has been reached.

In other features, a substrate etching method includes: selectively beginning plasma etching of a substrate within an etching chamber; and, during the plasma etching of the substrate: receiving a signal including endpoint information; decomposing the signal using empirical mode decomposition (EMD); and generating a filtered signal based on results of the EMD. The substrate etching method further includes: generating an indication when an endpoint of the plasma etching of the substrate has been reached based on the filtered signal; and ending the plasma etching of the substrate in response to the indication that the endpoint of the plasma etching of the substrate has been reached.

In other features, the results of the EMD include one or more components including endpoint information, one or more components including noise information, and a final residual, and the substrate etching method further includes generating the filtered signal based on: the one or more components including endpoint information and the final residual; and independent of the one or more components including noise information.

In other features, the substrate etching method further includes: receiving a second signal including endpoint information; receiving a third signal not including endpoint information; and normalizing the second signal relative to the third signal to produce the signal including endpoint information.

In other features, the substrate etching method further includes selecting the third signal based on one or more operating parameters of the substrate etching system.

In other features, the substrate etching method further includes selecting a confinement ring signal generated by a confinement ring sensor as the third signal when a confinement ring is moving within the etching chamber.

In other features, the substrate etching method further includes selecting a power signal indicating a power of the etching chamber as the third signal when a power supply that supplies power to the etching chamber is being tuned.

In other features, the substrate etching method further includes: generating the second signal using a first optical emission spectroscopy (OES) sensor based on optical characteristics of plasma within the etching chamber; and generating the third signal using a second OES sensor independently of the plasma within the etching chamber.

In other features, the substrate etching method further includes: normalizing a first portion of a second signal relative to a second portion of the second signal to produce the signal including endpoint information. The first portion of the second signal includes endpoint information, and the second portion of the second signal does not include endpoint information.

In other features, the substrate etching method further includes selecting the second portion of the second signal based on one or more operating parameters of the substrate etching system.

In other features, the substrate etching method further includes generating the indication that the endpoint of the plasma etching of the substrate has been reached when a change in the filtered signal is greater than a predetermined value.

In other features, the substrate etching method further includes: opening a gas source and actuating a power source to apply power to begin the plasma etching of the substrate; and closing the gas source and actuating the power source to end the plasma etching of the substrate in response to the indication that the endpoint of the plasma etching of the substrate has been reached.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 9A and 9B show graphs of an original signal and components of the original signal resulting from empirical mode decomposition.

In the drawings, reference numbers may be reused to identify similar and/or identical elements.

DETAILED DESCRIPTION

Detecting an endpoint of etching of a substrate can be difficult under some circumstances. For example, endpoint detection may become more difficult as an open area of the substrate decreases and an aspect ratio of structures on the substrate increases. Endpoint detection may also become more difficult where substrates have the same endpoint layer on both top and bottom surfaces.

Wafer processing may involve numerous cycles where each cycle includes etching during one period and deposition during another period. Due to the small measurement period available for endpoint detection (during only the etching period of each cycle), endpoint detection may be difficult. Complex subsystems, such as radio frequency (RF) power pulsing subsystems and gas pressure pulsing subsystems, may also introduce new types of noise into signals used to detect the endpoint.

According to the present disclosure, a signal including endpoint information is decomposed using empirical mode decomposition (EMD). The performance of EMD on the signal produces one or more signal components including endpoint information, one or more signal components including noise information, and a final residual. The signal components including noise information are eliminated, and a filtered signal is generated based on the signal component(s) including endpoint information and the final residual. The filtered signal therefore has a higher signal to noise ratio than the signal that was decomposed. Endpoint detection may therefore be more reliably performed based on the filtered signal.

The signal including endpoint information may be a normalized signal. The normalized signal may be generated by normalizing one signal including endpoint information relative to another signal that does not include endpoint information. The other signal that does not include endpoint information may be selected based on an expectation that it includes similar noise characteristics as the signal including endpoint information. Normalization prior to the EMD further increases the signal to noise ratio of the filtered signal.

Figure 1:
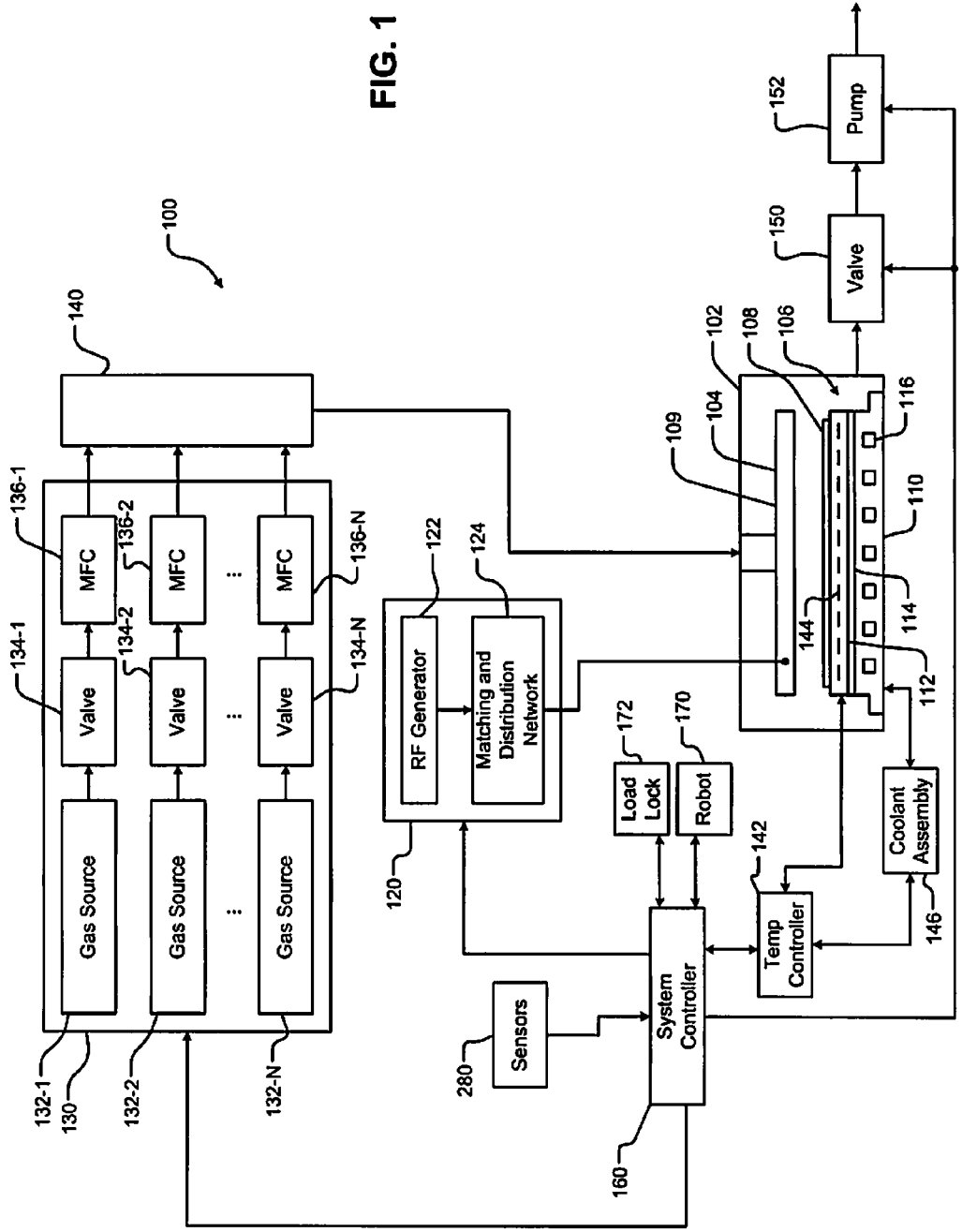
FIG. 1 shows an example substrate processing system for performing etching using radio frequency plasma.

FIG. 1 includes an example of a substrate processing system 100 for performing etching using radio frequency (RF) plasma. While the example in FIG. 1 relates to plasma enhanced chemical vapor deposition (PECVD), other types of processing chambers may be used. For example, inductively coupled plasma processing systems, remote plasma processing systems, etc. may be used. The substrate processing system 100 includes a processing chamber 102 that encloses other components of the processing chamber 102 and contains the RF plasma. The processing chamber 102 includes an upper electrode 104 and an electrostatic chuck (ESC) 106. During operation, a substrate 108 is arranged on the ESC 106.

For example only, the upper electrode 104 may include a showerhead 109 that introduces and distributes process gases. The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of thermal control elements (TCEs) 144 arranged in the heating plate 112. The temperature controller 142 may communicate with a coolant assembly 146 to control coolant flow through the channels 116. For example, the coolant assembly 146 may include a coolant pump and reservoir. The temperature controller 142 controls the coolant assembly 146 to control coolant flow through the channels 116 and, therefore, cooling of the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172.

Figure 2:
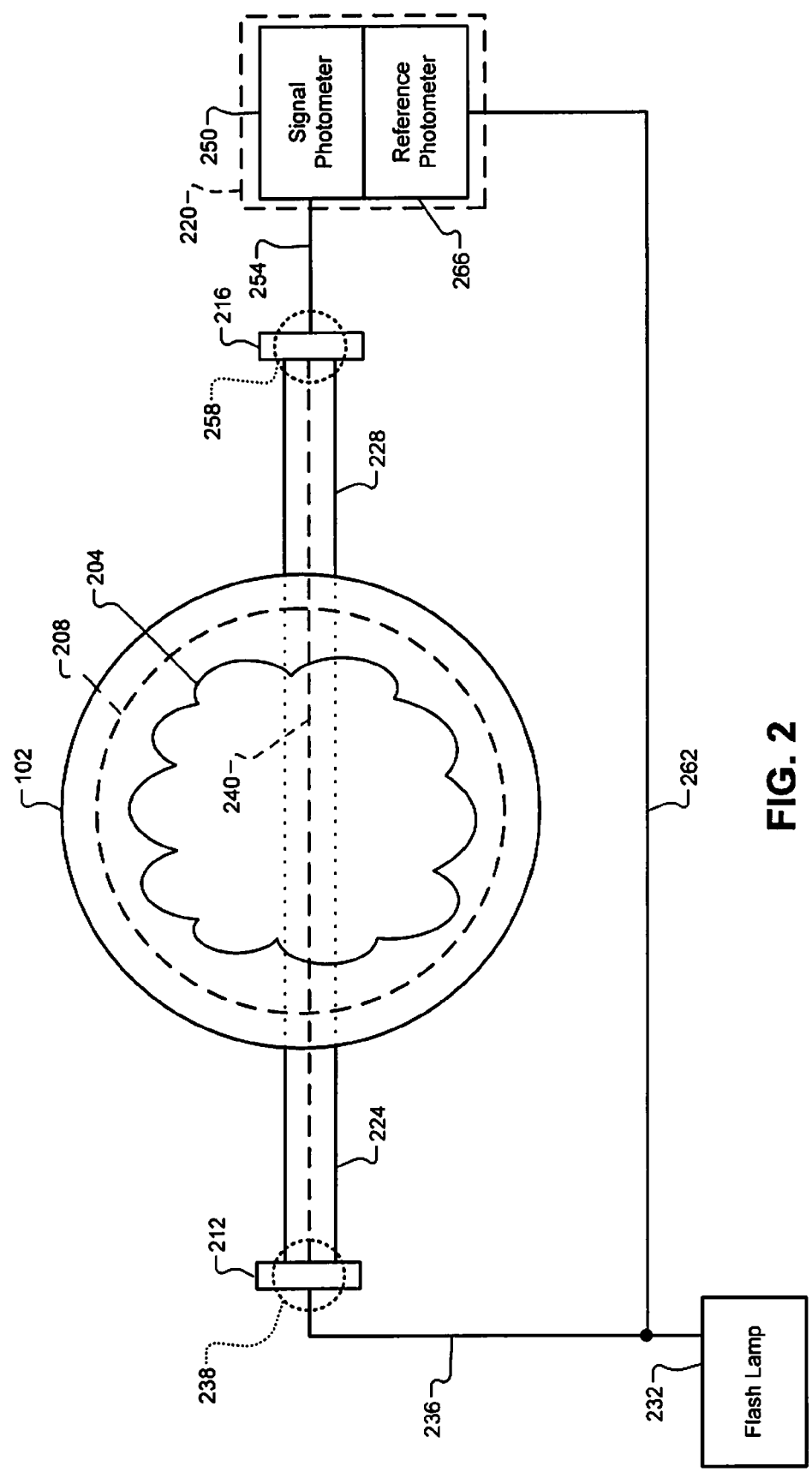
FIG. 2 shows an example schematic of an Optical Emission Spectroscopy (OES) system of a plasma processing system for optical interrogation of plasma.

FIG. 2 shows an example schematic of an Optical Emission Spectroscopy (OES) system for optical monitoring of plasma 204 in the processing chamber 102. Etching, deposition, and/or other substrate treatments may be performed in the processing chamber 102.

In one example, the processing chamber 102 may be configured with an optional confinement ring assembly 208. The processing chamber 102 may include two diametrically opposing quartz windows through which plasma 204 may be visible. For example, the processing chamber 102 may include a first quartz window 212 on an illumination side and a second quartz window 216 on a collection side. The illumination side may be the side of the processing chamber 102 that may be configured with an external light source to deliver light through the first quartz window 212. The collection side may be the side of the processing chamber 102 that optical emission spectra associated with plasma may be measured by a spectrometer 220 through the second quartz window 216.

A plurality of collimated optical assemblies, such as a first collimator 224 and a second collimator 228, may be employed to couple the quartz windows 212, 216 to the processing chamber 102. In one example, the quartz window 212 may be coupled to the illumination side of the processing chamber 102 with the first collimator 224. The quartz window 216 may be coupled to the collection side of the processing chamber 102 with the second collimator 228. The collimated optical assemblies, coupled at each quartz window, may be configured with converging and/or diverging optics (not shown to simplify illustration) that may have pre-determined angular acceptance for fiber optic coupling.

On the illumination side, a light signal from an external light source, such as a flash lamp 232, may be delivered into the processing chamber 102 via a first fiber optic bundle 236. The fiber optic bundle 236 may also be referred to as an illumination fiber optic bundle 236. The flash lamp 232 may be, for example, a Xenon flash lamp. The flash lamp 232 delivers a high-intensity, short-pulse light beam 240. The illumination fiber optic bundle 236 may be coupled at a first end to the flash lamp 232 and coupled at a second end to the quartz window 212 via an optical coupler 238.

The light signal 240 being delivered via illumination fiber optic bundle 236 into the processing chamber 102 may be collimated through the collimator 224. The intensity of light signal 240 may be several orders of magnitude higher in intensity relative to plasma 204 to provide a high signal to noise ratio. The light signal 240 and the optical emission spectra of plasma 204 may be collimated through collimator 228 to be transmitted to a signal photometer 250 of the (multi-channel) spectrometer 220 via a second fiber optic bundle 254. The fiber optic bundle 254 may be referred to as a collection fiber optic bundle 254.

On the collection side, the collection fiber optic bundle 254 may be coupled at a first end to the quartz window 216 via an optical coupler 258 and coupled at a second end to the signal photometer 250 of the spectrometer 220. The optical emission spectra of plasma 204 and/or light signal 240 from the processing chamber 102 may be collected and delivered via the collection fiber optic bundle 254 to the signal photometer 250 for measurement. The signal photometer 250 may include, for example, a charge-coupled device (CCD). The signal photometer 250 measures optical characteristics of light transmitted through the plasma 204 by the flash lamp 232.

The light signal 240 from the flash lamp 232 may also be transmitted via a third fiber optic bundle 262 to be measured by a reference photometer 266 of the spectrometer 220. The fiber optic bundle 262 may be referred to as a reference fiber optic bundle 262. The reference photometer 266 may include, for example, a CCD. The reference photometer 266 measures optical characteristics of light output by the flash lamp 232 without the effect of the plasma 204.

By employing the multi-channel spectrometer 220, the measurements from the signal photometer 250 may be normalized relative to the measurements from the reference photometer 266. The measurements of the signal photometer 250, however, may be normalized relative to another suitable parameter, as discussed further below.

Referring back to FIG. 1, the substrate processing system 100 includes a plurality of sensors 280. The sensors 280 include the signal and reference photometers 250 and 266 and other sensors associated with the processing chamber 102. The other sensors may include, for example, one or more gas pressure sensors, one or more temperature sensors, one or more electrical parameter sensors (e.g., voltage, current, or power) associated with the RF generating system 120, and/or one or more other parameters.

As discussed further below, the system controller 160 detects an endpoint of etching based on signals from one or more of the sensors 280. For example, the system controller 160 may detect the endpoint based on the signals from the signal photometer 250.

Endpoint detection, however, may be more difficult under some circumstances. For example, endpoint detection may become more difficult as substrate open area decreases and/or as substrate aspect ratio increases because signal magnitude and, therefore, a change at the endpoint may decrease. Endpoint detection may also be more difficult for substrate stacks having the same layer on both top and bottom surfaces of the aspect ratio. Additional noise may also be present in the signals, for example, due to more complex chemistry (e.g., simultaneous etch/deposition cycles), RF pulsing, pressure pulsing, etc.

The system controller 160 improves signal to noise ratio by performing empirical mode decomposition (EMD) on a signal including endpoint detection information. In various implementations, the signal may be normalized before the EMD to further improve the signal to noise ratio. The system controller 160 can more reliably detect the endpoint using the signal resulting from the EMD. Noise separated from the signal via the EMD may also be used to diagnose one or more conditions.

Figure 3:
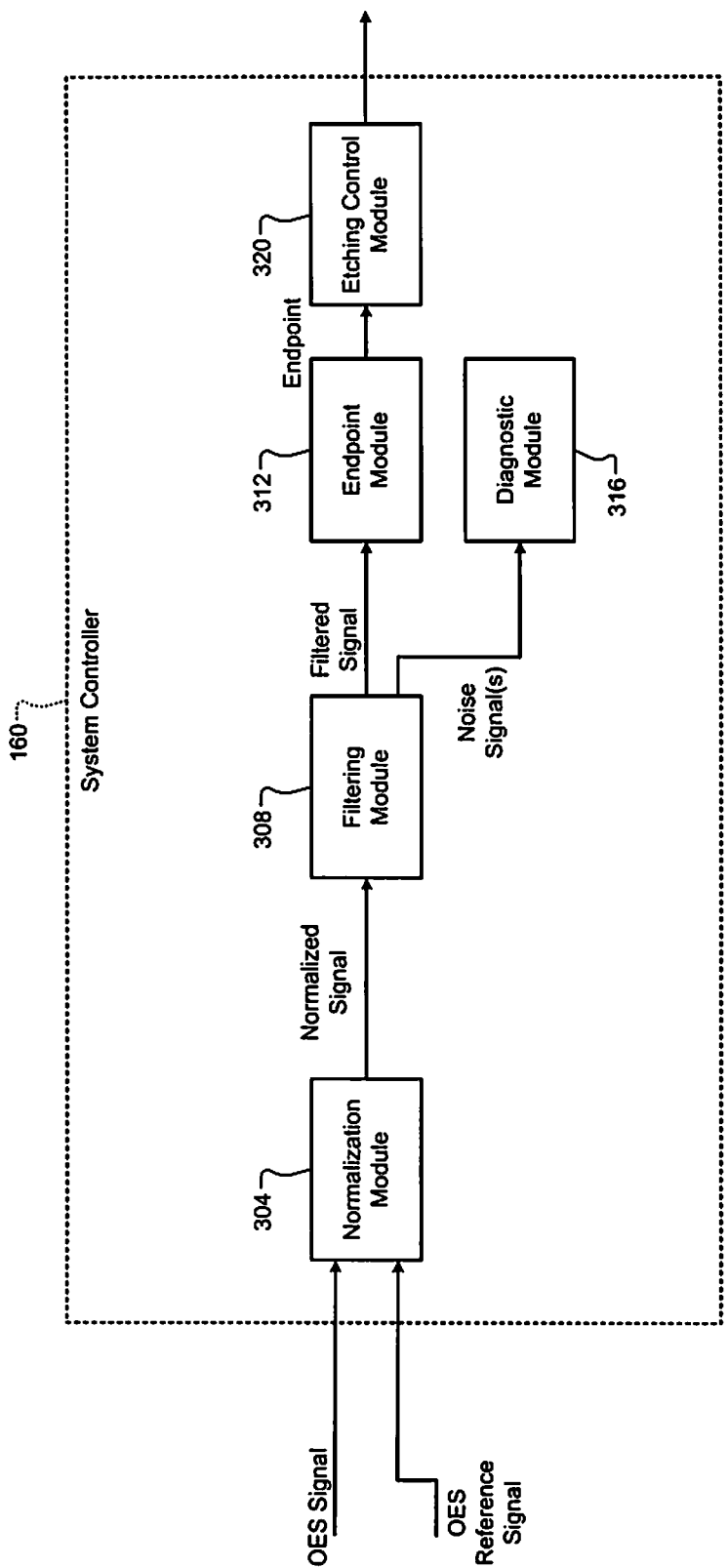
FIG. 3 shows a functional block diagram of an example system controller.

FIG. 3 includes a functional block diagram of an example implementation of the system controller 160. The system controller 160 includes a normalization module 304 that normalizes a first signal including endpoint information relative to a second signal that does not include endpoint information but that includes similar noise characteristics as the first signal.

The normalization module 304 may, for example, normalize the OES signal from the signal photometer 250 based on the OES reference signal from the reference photometer 266. For example only, the normalization module 304 may set a normalized signal equal to or based on a wavelength of the OES signal from the signal photometer 250 divided by a wavelength of the OES reference signal from the reference photometer 266 that is expected to have similar noise characteristics as the wavelength of the OES signal. Alternatively, the normalization module 304 may set the normalized signal equal to or based on the wavelength of the OES reference signal from the reference photometer 266 divided by the wavelength of the OES signal from the signal photometer 250.

Figure 4:
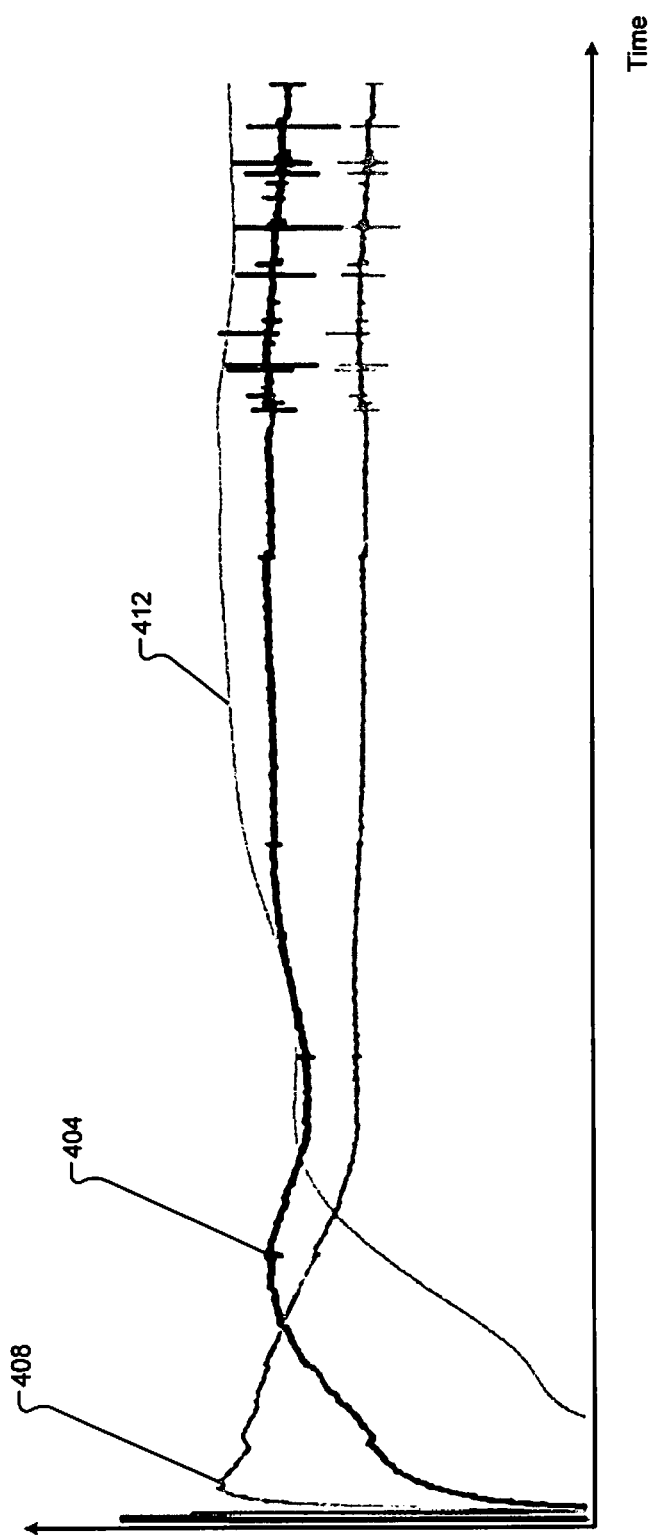
FIG. 4 shows a graph including a first signal including endpoint information, a second signal not including endpoint information, and a normalized signal generated by normalizing the first and second signals.

For example in FIG. 4, trace 404 tracks a first wavelength (e.g., 225 nanometers (nm)) of the OES signal, and trace 408 tracks a second wavelength (e.g., 206 nm) of the OES reference signal. The endpoint of etching can be detected based on one or more characteristics exhibited in the first wavelength of the OES signal. Based on prior testing, the second wavelength of the OES reference signal is expected to have similar noise characteristics as the first wavelength of the OES signal.

Trace 412 tracks a normalized signal. The normalization signal corresponds to trace 404 divided by trace 408. As shown by trace 412, the spikes in traces 404 and 408 at least partially cancel each other. This cancellation may render endpoint detection more reliable using the normalized signal.

While the example of normalizing the OES signal relative to the OES reference signal has been discussed, the normalization may be made using a different first signal including endpoint information and/or a different second signal that does not include endpoint information but that includes similar noise characteristics as the first signal. The normalization module 304 may select the first signal including endpoint information and the second signal that does not include endpoint information based on one or more current operating parameters.

For example, when noise is due to movement of the confinement ring assembly 208, the normalization module 304 may generate the normalized signal based on a ratio of a wavelength of the OES signal relative to a confinement ring signal, such as confinement ring position signal. Confinement ring position may be measured using a confinement ring position sensor.

As another example, when noise is due to tuning of power of the RF generating system 120, the normalization module 304 may generate the normalized signal based on a ratio of a wavelength of the OES signal relative to a reflected (or delivered) power signal. As another example, the first signal including endpoint information may include a bias voltage applied for etching, and the second signal not including endpoint information may be power applied to the ESC 106.

As stated above, the normalization module 304 may select the first signal including endpoint information and the second signal that does not include endpoint information based on one or more current operating parameters. The normalization module 304 may also select the relevant portions (e.g., wavelengths) of the first and second signals based on one or more current operating parameters.

While normalization of two different signals have been discussed above, the normalization module 304 may normalize two different portions of the same signal in various implementations. For example, the normalization module 304 may set the normalized signal based on or equal to a ratio of a first wavelength of the OES signal including endpoint information to a second wavelength of the OES signal not including endpoint information but including similar noise characteristics as the first wavelength. In this example, the second wavelength is different than the first wavelength.

To deal with noise and/or discontinuity in a signal including endpoint information, one or more digital filters could be used. Digital filters, however, introduce delay and transient propagation. Also, digital filters require a user to properly select characteristics of the digital filter(s), such as filter type, cutoff frequency, etc. As such, a large amount of knowledge/experience is needed on the part of the user to properly tailor the digital filter(s) to the particular application.

According to the present disclosure, a filtering module 308 filters the normalized signal using empirical mode decomposition (EMD) to produce a filtered signal. While the example of filtering the normalized signal is shown and will be discussed, the normalization may be omitted, and the filtering module 308 may filter the first signal including endpoint information to produce the filtered signal. Use of EMD eliminates the need for a user to tailor and/or choose digital filter(s) for the application.

The system controller 160 includes an endpoint module 312 and a diagnostic module 316. The endpoint module 312 indicates when an endpoint of etching has been reached based on the filtered signal. The endpoint is reached when etching has reached a stop layer of a substrate. The endpoint module 312 may indicate that the endpoint has been reached, for example, when the filtered signal changes from having a positive slope to a negative slope, changes from having a negative slope to a positive slope, changes by at least a predetermined amount, and/or includes one or more other predetermined characteristics. Characteristics of the filtered signal that are indicative of the reaching of the endpoint may vary by application and may be set for use by the endpoint module 312.

By way of the EMD, one or more noise signals are extracted from the normalized signal to produce the filtered signal. The diagnostic module 316 may diagnose the presence of one or more conditions within the processing chamber 102 based on the noise signal(s).

EMD is applicable to linear and non-linear signals and also for signals having non-stationary properties. Using EMD, the filtering module 308 decomposes the normalized signal into two or more different modes and a final residual. Summing all of the modes and the final residual yields the normalized signal. The concept of EMD can be written in equation form as:

$$S(t)=\text{sum}[\text{Modes}(t)]+R(t),$$

where S(t) is the normalized signal at time t, sum [ ] indicates use of the sum (addition) function, Modes(t) are all of the modes generated via the EMD, and R(t) is the final residual at time t.

EMD is based on an iterative sifting process where the average of upper and lower envelopes of a signal are extracted from the signal until a difference between a number of zero-crossings and a number of maxima is equal or less than 1 and criteria of symmetry is satisfied. When those criteria are met, the extracted signal is considered a mode. The mode is then extracted from the original signal, and the remaining signal is processed the same way as descried above until the remaining signal has no more zero-crossings. When the remaining signal does not include any zero crossings, the remaining signal is the final residual and corresponds to the DC component of the original signal. The number of modes depends on the composition of the initial signal.

Figure 5:
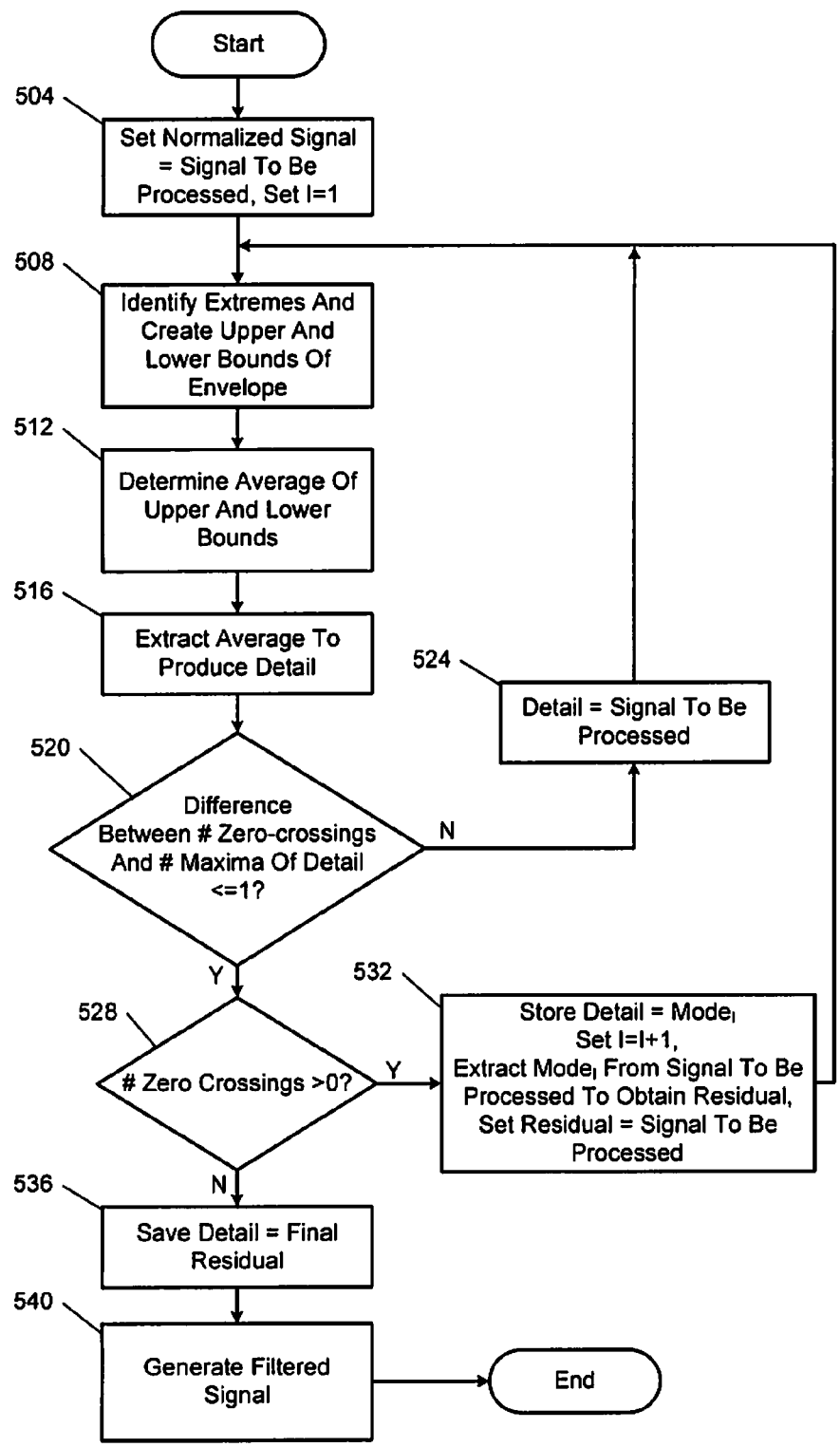
FIG. 5 shows an example method of performing empirical mode decomposition.

FIG. 5 includes a flowchart depicting an example of performing EMD on the normalized signal. Control begins with 504 where the filtering module 308 sets a variable l=1 (for mode 1), sets an indicator that the normalized signal is the signal to be processed, and begins performing EMD. The OES and OES reference signals are sampled at a predetermined sampling rate, such as approximately every 0.1 seconds (corresponding to 10 Hertz (Hz)). The normalized signal is therefore updated at the predetermined sampling rate. The filtering module 308 begins once a predetermined period has passed after etching begins. In other words, the filtering module 308 begins once a predetermined number of samples of the normalized signal have been obtained.

At 508, the filtering module 308 identifies maximum and minimum values of the signal to be processed. The filtering module 308 fits a first curve to the maximum values of the signal to be processed at 508, for example, using cubic spline interpolation. This curve therefore defines an upper limit of an envelope for the signal to be processed. The filtering module 308 also fits a second curve to the minimum values of the signal to be processed at 508, for example, using cubic spline interpolation. This curve defines a lower limit of the envelope for the signal to be processed. In the first instance of 508, the normalized signal is the signal to be processed.

At 512, the filtering module 308 averages the first and second curves at each sampling time to produce an average signal. At 516, the filtering module 308 extracts the average signal from the signal to be processed. In other words, the filtering module 308 subtracts the points of the average signal from the points of the signal to be processed, respectively. The resulting signal will be referred to as a detail signal. The determination of the detail signal can be written as an equation as:

$$d(t)=\text{STBP}(t)-\text{avg}(t),$$

where d(t) is the detail signal at time t, STBP(t) is the signal to be processed at time t, and avg(t) is the average signal at time t. The signal to be processed will be the normalized signal at the first iteration of 516. During later iterations, a detail signal or a residual signal will be the signal to be processed, as discussed further below.

At 520, the filtering module 308 determines whether a difference between (i) the number of zero crossings of the detail signal and (ii) the number of maximum values of the detail signal are less than or equal to 1. If 520 is false, the filtering module 308 sets the detail signal to the signal to be processed (STBP) at 524, and control returns to 508 and process the detail signal via 508-516. If 520 is true, control continues with 528.

At 528, the filtering module 308 determines whether the number of zero-crossings of the detail signal are greater than zero. If 528 is true, the detail signal is stored as the i-th mode (Mode$_l$) at 532. Also at 532, the filtering module 308 also extracts the i-th mode from the signal to be processed to produce a residual signal and sets the residual signal to the signal to be processed. The filtering module 308 also increments the variable l (l=l+1) at 532. Control then returns to 508 to process the residual signal to determine the next mode. The determination of the residual signal can be written as an equation as:

$$r(t)=\text{STBP}(t)-\text{Mode}_l(t),$$

where r(t) is the residual signal at time t, STBP(t) is the signal to be processed at time t, and Mode$_l$(t) is the i-th mode at time t. If 528 is false, and the detail signal does not include any zero-crossings, control continues with 536.

At 536, when the detail signal does not include any zero-crossings, the filtering module 308 sets the detail signal as the final residual signal. The filtering module 308 generates the filtered signal at 540 based on the mode signals stored and the final residual signal. Examples of how to generate the filtered signal are discussed further below. While the example of FIG. 5 is shown as ending after 540, FIG. 5 is illustrative of only one control loop and control returns to 504.

Using EMD, the first stored mode (mode1) corresponds to the fastest and highest frequency fluctuations of the normalized signal. The last stored mode corresponds to the slowest and lowest frequency of fluctuations of the normalized signal. The final residual corresponds to a pure DC or trend of the normalized signal. The sum of the modes and the final residual produces the normalized signal. EMD allows decomposition of the normalized signal into modes that have useful (endpoint) information from modes that include noise.

Figure 6:
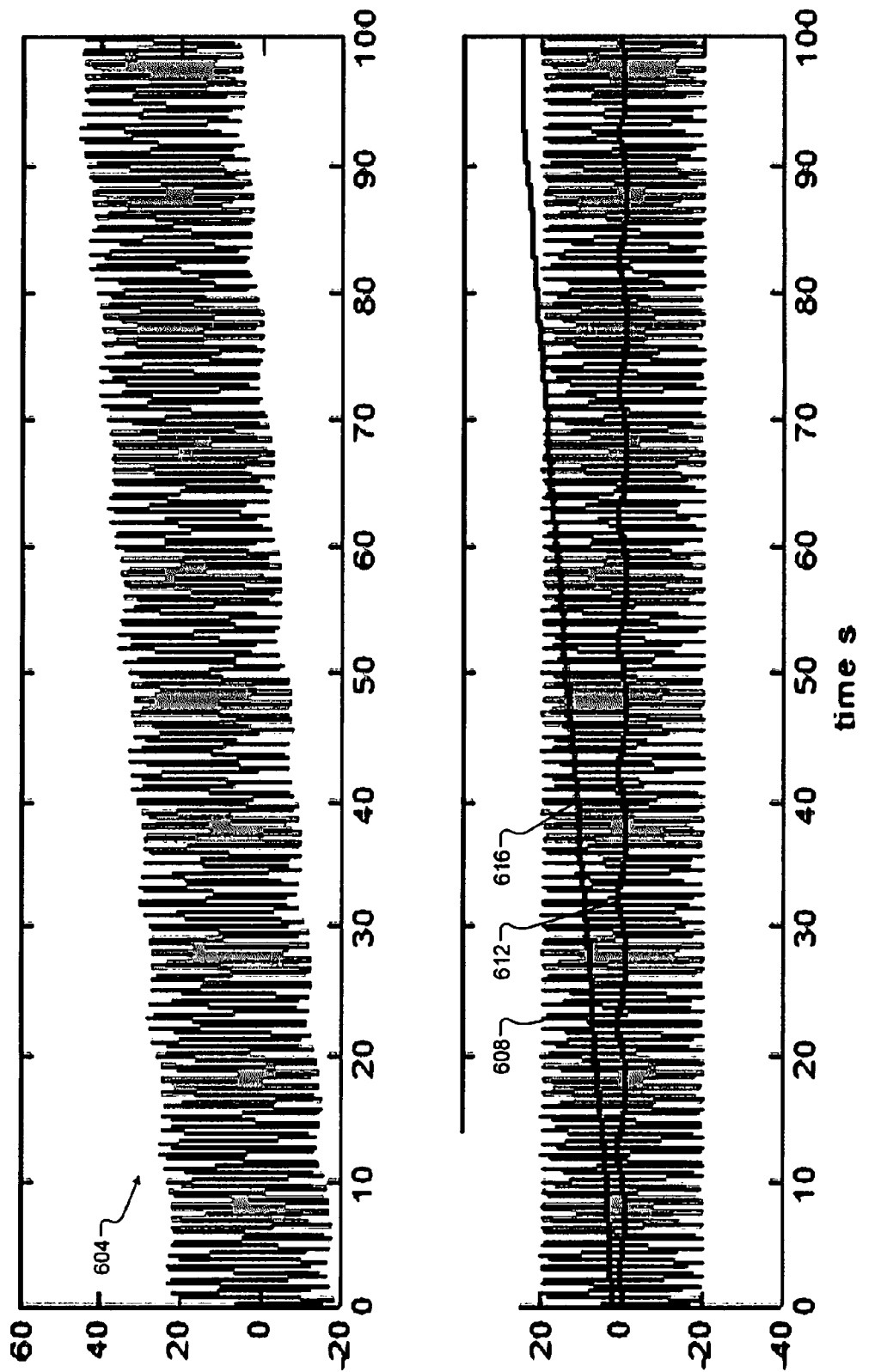
FIG. 6 shows a graph of an original signal and components of the original signal resulting from empirical mode decomposition.

FIG. 6 includes a graph including an original signal 604 prior to the use of EMD. Applying EMD to the original signal 604 produces: mode 1 indicated by 608 and mode 2 indicated by 612; and a final residual indicated by 616.

As an example, the EMD can be updated and the filtered signal can be generated based on all previous points of the normalized signal each time when a new point is received. For example, as stated above, the filtering module 308 can begin performing the EMD when a predetermined number X of data points have been received during a predetermined period after etching begins (e.g., 15 seconds, corresponding to 150 points at a sampling frequency of 10 Hz). The number of data points used in the EMD and the generation of the filtered signal increases by one each time another data point is received. With the example of a 15 second predetermined period and a 10 Hz predetermined sampling frequency, a first point of the filtered signal will be generated based on the points within the preceding 15 second predetermined period, a second point of the filtered signal will be generated based on the points within the preceding 15.1 second window, a third point of the filtered signal will be generated based on the points within the preceding 15.2 second window, etc.

In another example, the EMD can be performed and the filtered signal can be based on a window of the most recently received points of the normalized signal that moves each time a new point of the normalized signal is received. For example, with the example of a 15 second predetermined period and a 10 Hz predetermined sampling frequency, a first point of the filtered signal will be generated based on the points between time 0 and 15 seconds, a second point of the filtered signal will be generated based on the points between 0.1 and 15.1 seconds, a third point of the filtered signal will be generated based on the points between 0.2 and 15.2 seconds, etc.

Figure 7:
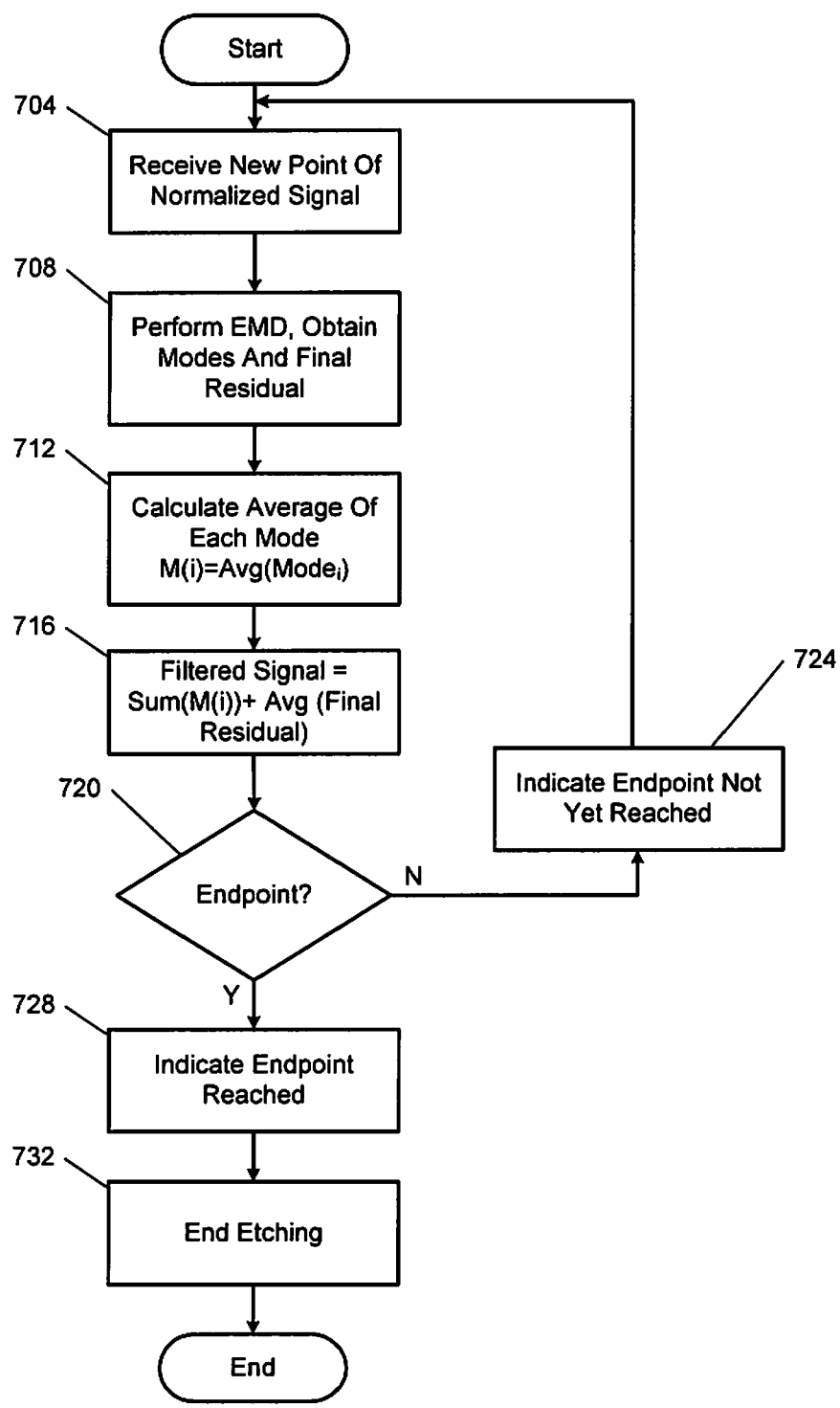
FIGS. 7 and 8 show example methods of generating a filtered signal based on results of empirical mode decomposition.

The filtered signal can be generated based on the modes and the final residual in a plurality of ways. FIG. 7 is a flowchart depicting an example method of generating the filtered signal. In FIG. 7, each of the modes are individually averaged and summed with an average of the final residual to generate a single point of the filtered signal. This will cancel the noise due to its symmetry and maintain the DC component summation. This example is relatively fast (computationally) and avoids the need to select which modes to keep (for inclusion of endpoint information) and which modes to reject (for inclusion of noise). However, if the all previous points of the normalized signal are used, computational efficiency decreases and computational effort increases as each new point is received. A delay may also be introduced in this example.

Control may begin with 704 where the filtering module 308 receives a new point of the normalized signal. At 708, the filtering module 308 performs EMD, as discussed above, to generate the modes and the final residual of the normalized signal.

At 712, the filtering module 308 calculates the average of each of the mode signals. For example, the filtering module 308 calculates a first average of the values of the first mode signal ($Mode_1$), calculates a second average of the values of the second mode signal ($Mode_2$), etc. The filtering module 308 may also calculate an average of the values of the final residual signal at 712.

At 716, the filtering module 308 sets the filtered signal equal to or based on a sum of the averages of the mode signals, respectively, and the average of the final residual signal. At 720, the endpoint module 312 determines whether the endpoint of etching has been reached based on the filtered signal (e.g., the value of the filtered signal at time t and one or more previous values of the filtered signal). If 720 is false, the endpoint module 312 indicates that the endpoint has not yet been reached at 724, and control returns to 704. If 720 is true, the endpoint module 312 indicates that the endpoint of etching has been reached at 728, and control continues with 732. For example, the endpoint module 312 may indicate that the endpoint of etching has been reached when the filtered signal changes from having a positive slope to a negative slope, when the filtered signal changes from having a negative slope to a positive slope, when a slope of the filtered signal is greater than a predetermined value or less than a predetermined value, and/or when one or more other suitable conditions are satisfied.

At 732, an etching control module 320 (FIG. 3) ends etching of a substrate within the processing chamber 102. For example, the etching control module 320 may disable the flow of one or more etching gasses into the processing chamber 102, disable application of power to the processing chamber 102, and or perform one or more actions at 732.

Figure 8:
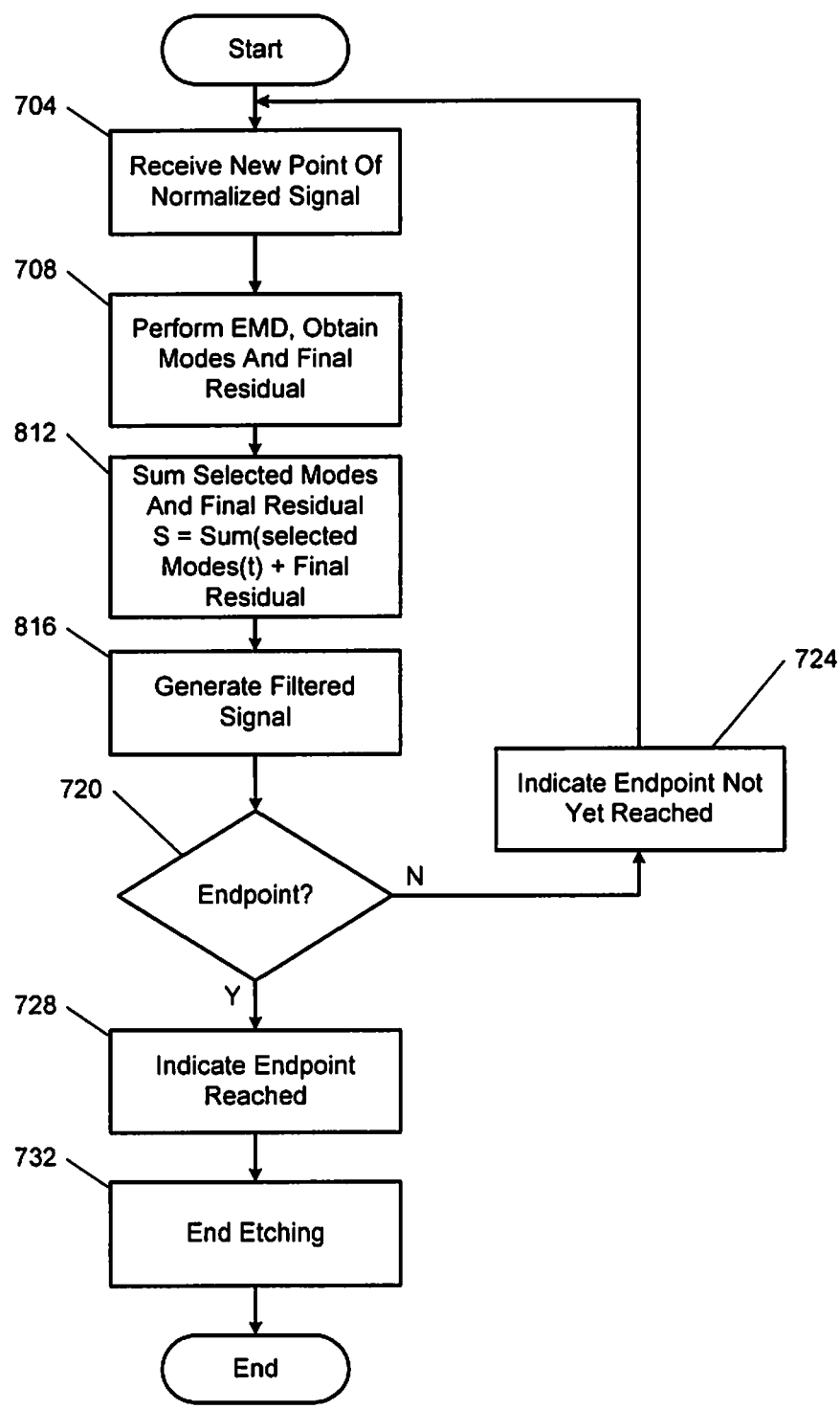

FIG. 8 is a flowchart depicting another example method of generating the filtered signal. In FIG. 8, only selected modes resulting from the EMD are used to generate the filtered signal. Control proceeds with 704-708, as discussed above. At 812, the filtering module 308 sums selected ones of the modes and the final residual over time. For example, the filtering module 308 may select modes empirically found to include endpoint information and not select modes empirically found to include noise. In an example, the filtering module 308 may select the last X number of modes (closest to the final residual) and omit the first Y number of modes ($Mode_1$–$Mode_Y$), where X+Y are integers greater than zero and X+Y=a total number of modes resulting from the EMD. This can be written in equation form as:

$$S(t)=\text{sum}(\text{selected modes}(t))+FR(t),$$

where S(t) is the result of the sum at time t, selected modes(t) are the values of the selected ones of the modes resulting from the EMD at time t, and FR(t) is the value of the final residual resulting from the EMD at time t.

At 816, the filtering module 308 generates the filtered signal based on the sum. For example, the filtering module 308 may set the filtered signal equal to the sum. As another example, the filtering module 308 may set the filtered signal based on or equal to:

$$\frac{\alpha(S(t) - PrevS(t)) + \beta(S(t))}{\alpha + \beta},$$

where $\alpha$ and $\beta$ are predetermined values, a sum of $\alpha$ and $\beta$ is equal to 1, S(t) is the sum at time t from 812, and PrevS(t) is the sum at time t determined during a last iteration of 812. In various implementations, $\beta$ may be greater than $\alpha$. When $\beta$ is set to 1 and $\alpha$ is set to 0, the filtering module 308 may set the filtered signal equal to or based on the sum from 812. Control proceeds with 720-732, as discussed above.

FIG. 9A includes a graph including an original signal 904 prior to the use of EMD. The original signal 904 includes an increase in noise approximately between times 50 and 60 seconds.

FIG. 9B includes a graph including components of the original signal resulting from EMD. Applying EMD to the original signal 904 produces six modes and a final residual. Mode 1 is indicated by trace 908 and mode 2 is indicated by trace 912. As indicated, mode 1 includes noise in the original signal, and mode 2 includes noise corresponding to the increase in noise between approximately times 50 and 70 seconds. Mode 2 can be correlated (normalized) with another signal. Mode 1, however, is constant except for between approximately times 50 and 60 seconds. As such, the noise of Mode 1 is constant and not changing over time and, therefore, can be considered natural noise of the system.

The diagnostic module 316 may diagnose subsystem (e.g., etching chamber) behavior, whole chamber behavior, substrate results, and/or the presence of one or more other conditions based on the Mode 2. While the example of FIG. 3 is shown as one EMD being used to produce both the noise signals for the diagnostic module 316 and the filtered signal for the endpoint module 312, two filtering modules performing 2 EMDs may be used.

Figure 10:
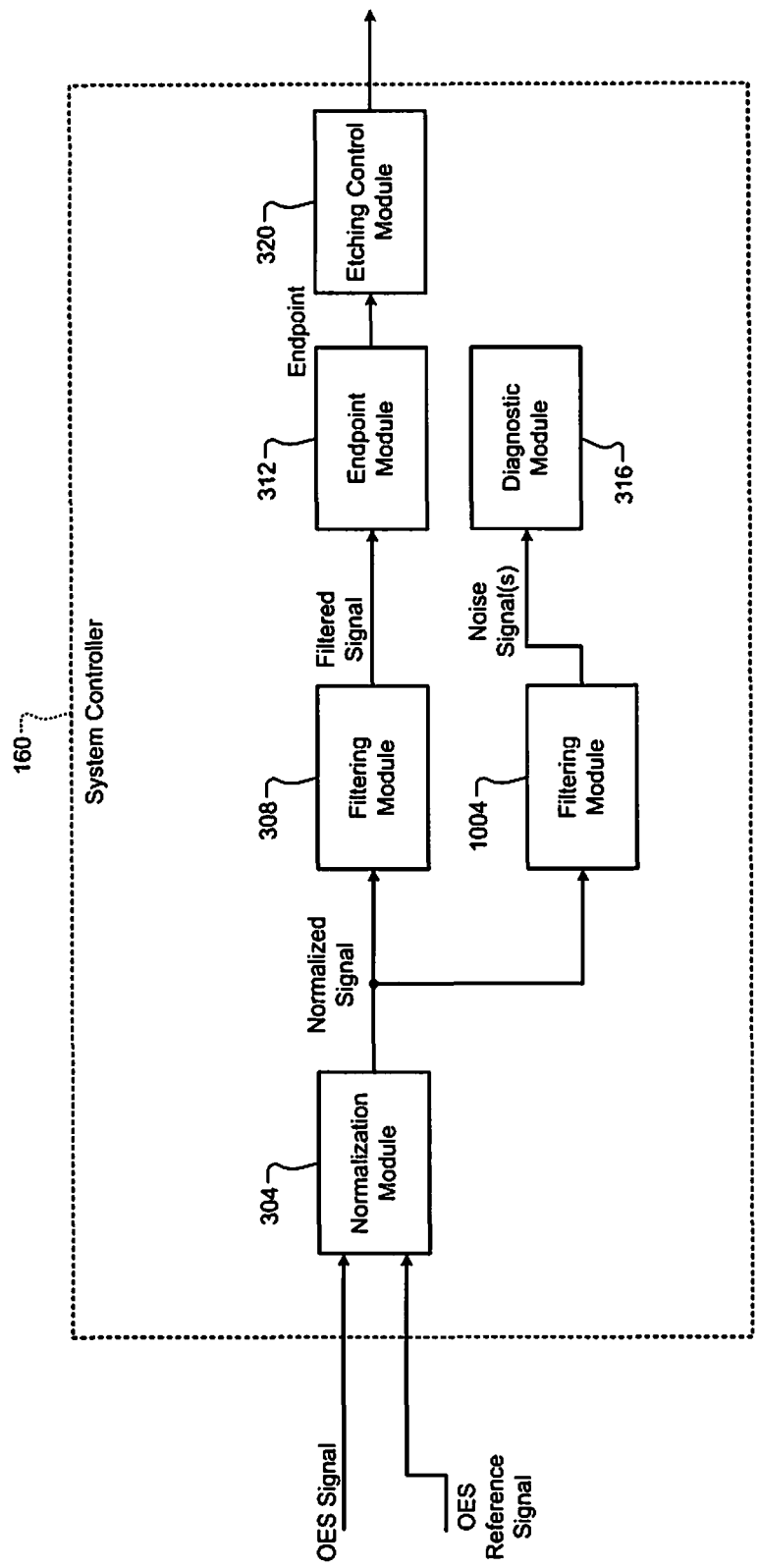
FIG. 10 shows a functional block diagram of an example system controller.

FIG. 10 shows an example schematic of the system controller 160 also including a second filtering module 1004. The second filtering module 1004 performs an EMD on the normalized signal, removes modes including endpoint information, and provides noise signals including noise information (and not including endpoint information) to the diagnostic module 316. The EMDs performed by the filtering module 308 and the second filtering module 1004 may be the same or different, such as based on the same or different predetermined numbers of points, the same or different windows of samples, the same or different types of windows, etc.

The diagnostic module 316 may output an indicator of a warning, fault, or error based on the noise signals satisfying one or more predetermined criteria. For example only, the diagnostic module 316 may set a predetermined code in memory indicative of the warning, fault, or error, visually indicate the warning, fault or error on a display, illuminate an indicator lamp, and/or output one or more indicators of the warning, fault or error. Alternatively, the diagnostic module 316 may count, track, or monitor a number of instances when the noise signals satisfy one or more predetermined criteria. The diagnostic module 316 may also process the noise signals before performing one or more diagnostics. For example, the diagnostic module 316 may perform a Fourier Analysis on the noise signals and resulting filtered noise signals.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise substrate processing equipment, including a processing tool or tools, chamber or chambers, a platform or platforms for processing, and/or specific processing components (a substrate pedestal, a gas flow system, etc.). These systems may be integrated with electronics for controlling their operation before, during, and after processing of substrate, such as a semiconductor wafer. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, substrate transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a substrate or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a substrate.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the substrate processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other processing systems that may be associated or used in the fabrication and/or manufacturing of substrates.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of substrates to and from tool locations and/or load ports in a manufacturing factory.

In this application, including the definitions below, the term "module" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The functionality of any given module of the present disclosure may be distributed among multiple modules. The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

None of the elements recited in the claims are intended to be a means-plus-function element within the meaning of 35 U.S.C. §112(f) unless an element is expressly recited using the phrase "means for," or in the case of a method claim using the phrases "operation for" or "step for."

What is claimed is:

1. A substrate etching method comprising:
   selectively beginning plasma etching of a substrate within an etching chamber of a substrate etching system;
   during the plasma etching of the substrate:
      receiving a signal including endpoint information;
      decomposing the signal using empirical mode decomposition (EMD); and
      generating a filtered signal based on results of the EMD; and
   generating an indication when an endpoint of the plasma etching of the substrate has been reached based on the filtered signal; and
   ending the plasma etching of the substrate in response to the indication that the endpoint of the plasma etching of the substrate has been reached.

2. The substrate etching method of claim 1 wherein the results of the EMD include one or more components including endpoint information, one or more components including noise information, and a final residual, the method further comprising;
   generating the filtered signal based on:
      the one or more components including endpoint information and the final residual;
      and independent of the one or more components including noise information.

3. The substrate etching method of claim 1 further comprising:
   receiving a second signal including endpoint information;
   receiving a third signal not including endpoint information; and
   normalizing the second signal relative to the third signal to produce the signal including endpoint information.

4. The substrate etching method of claim 3 further comprising selecting the third signal based on one or more operating parameters of the substrate etching system.

5. The substrate etching method of claim 3 further comprising selecting a confinement ring signal generated by a confinement ring sensor as the third signal when a confinement ring is moving within the etching chamber.

6. The substrate etching method of claim 3 further comprising selecting a power signal indicating a power of the etching chamber as the third signal when a power supply that supplies power to the etching chamber is being tuned.

7. The substrate etching method of claim 3 further comprising:
   generating the second signal using a first optical emission spectroscopy (OES) sensor based on optical characteristics of plasma within the etching chamber; and
   generating the third signal using a second OES sensor independently of the plasma within the etching chamber.

8. The substrate etching method of claim 1 further comprising:
- normalizing a first portion of a second signal relative to a second portion of the second signal to produce the signal including endpoint information,
- wherein the first portion of the second signal includes endpoint information, and
- wherein the second portion of the second signal does not include endpoint information.

9. The substrate etching method of claim 8 further comprising selecting the second portion of the second signal based on one or more operating parameters of the substrate etching system.

10. The substrate etching method of claim 1 further comprising generating the indication that the endpoint of the plasma etching of the substrate has been reached when a change in the filtered signal is greater than a predetermined value.

11. The substrate etching method of claim 1 further comprising:
- opening a gas source and actuating a power source to apply power to begin the plasma etching of the substrate; and
- closing the gas source and actuating the power source to end the plasma etching of the substrate in response to the indication that the endpoint of the plasma etching of the substrate has been reached.

* * * * *